United States Patent [19]

Keeth

[11] Patent Number: 5,651,011
[45] Date of Patent: Jul. 22, 1997

[54] METHOD AND APPARATUS FOR INITIATING AND CONTROLLING TEST MODES WITHIN AN INTEGRATED CIRCUIT

[75] Inventor: Brent Keeth, Boise, Id.

[73] Assignee: Micron Technology, Inc., Boise, Id.

[21] Appl. No.: 456,534

[22] Filed: Jun. 1, 1995

[51] Int. Cl.$^6$ .................................................. G06F 11/00
[52] U.S. Cl. ............................................... 371/22.1
[58] Field of Search ................... 371/22.1, 22.2, 371/22.4, 22.5, 22.6, 27, 28; 365/189.08; 323/313

[56] References Cited

U.S. PATENT DOCUMENTS

| 4,896,296 | 1/1990 | Turner et al. | 365/189 |
| 5,373,227 | 12/1994 | Keeth | 323/313 |
| 5,384,739 | 1/1995 | Keeth | 365/189 |

Primary Examiner—Vincent P. Canney
Attorney, Agent, or Firm—Schwegman, Lundberg, Woessner & Kluth, P.A.

[57] ABSTRACT

The method for initiating and controlling integrated circuit testing includes providing a plurality of test modes with each test mode having a corresponding test mode address vector. A test enable cycle is enabled by executing an unlock enable cycle with a predetermined lockout address vector and at least one particular test mode of the plurality of test modes is initiated by executing the test enable cycle with a test mode address vector corresponding to the at least one particular test mode. The method may also include latching the at least one particular test mode of the plurality of test modes, detecting supply voltage applied to the integrated circuit, and clearing the latched at least one particular test mode as a function of the detected supply voltage. The test enable cycle may also include a supervoltage test enable cycle executable with a supervoltage.

30 Claims, 4 Drawing Sheets

METHOD AND APPARATUS FOR INITIATING AND CONTROLLING TEST MODES WITHIN AN INTEGRATED CIRCUIT

FIELD OF THE INVENTION

The present invention relates to testing of integrated circuits. More particularly, the present invention relates to the initiating and controlling of test modes in integrated circuit testing.

BACKGROUND OF THE INVENTION

Integrated circuits (ICs), including memory devices such as dynamic random access memories (DRAMs) require testing to enhance the ability of the user of such parts to determine the integrity of, or to characterize, the devices. Such testing may be implemented through test modes that include special tests, measurement functions, or algorithms to provide the user with such integrity or characteristics of the devices being tested. Test modes are utilized to test devices as opposed to operational modes which, for example, alter the operational characteristics of the device and which are intended to be used in system operation. For example, in operational mode, operational characteristics of a DRAM would be altered, but such alteration would not interfere with the DRAM's function as a storage device. For DRAM devices, Jedec Standard No. 21-C defines a scheme for controlling a series of special modes for the address multiplexed DRAMs and the logic interface required to enter, control, and exit the special modes. In addition, it defines special test and operational modes.

The Jedec Standard No. 21-C provides that special modes are to be initiated by a clock sequence called "write enable and column address strobe (CAS) before row address strobe (RAS)," which may be referred to as a WCBR clock sequence. The WCBR sequence is shown in FIG. 3 herein. When this clock sequence is generated, the state of address keys define a test mode or operational mode to be selected. The mode is latched and remains in effect until a release cycle is generated, or a new initiating cycle defining some other mode is generated. Following the initiating cycle, all subsequent cycles except for refresh cycles will be operating cycles as allowed by the mode selected. As further provided in the Jedec Standard, the test modes are cleared and the memory device returned to its normal operational state by application of any normal refresh cycle, for example a "RAS only refresh," or a "CAS before RAS refresh (CBR)." The Jedec Standard No. 21-C describes various other testing functions, and the standard is herein incorporated in its entirety by reference thereto.

Prior memory devices, such as DRAMs have utilized WCBR supervoltage cycles for initiation and control of test modes. For example, test modes are entered via an address input of the memory device by applying a supervoltage to a supervoltage pin while performing a WCBR cycle. The test mode address vector for the test mode to be selected is applied to the address input and used to configure each test mode. The test mode selected and entered is then valid as long as the supervoltage is applied. As long as the supervoltage is applied to the supervoltage pin, additional test modes can be entered via the address input during subsequent WCBRs. If the supervoltage applied is removed, all selected test modes are cleared. A CBR and RAS only refresh will not kick you out of the selected test modes. Only removing the supervoltage from the supervoltage pin will clear all the selected test modes.

There are various circumstances which decrease the reliability of initiating and controlling various test modes for testing integrated circuits, in particular memory devices such as DRAMs. For example, during powerup, or during power supply surges, there is a possibility of accidentally entering test modes when it is not desired to enter such test modes. Further, without adequate safeguards, test modes as opposed to other modes such as operational modes may also be accidentally entered when undesired. Present devices do not include adequate safeguards and therefore, there is a need in the art to provide such safeguards to increase the reliability for operation of the test modes and the testing process.

SUMMARY OF THE INVENTION

The present invention provides safeguards for increasing the reliability of the testing process by providing method and apparatus for initiating and controlling test modes. Such method and apparatus decreases the likelihood of accidentally entering test modes when it is undesired to do so.

The method for initiating and controlling integrated circuit testing in accordance with the present invention includes providing a plurality of test modes, each test mode having a corresponding test mode address vector. A test enable cycle is enabled by executing an unlock enable cycle with a predetermined lockout address vector. Then, at least one particular test mode of the plurality of test modes is initiated by executing the test enable cycle with a test mode address vector corresponding to the at least one particular test mode. In one embodiment of the method, the test enable cycle includes a supervoltage test enable cycle which is executable with a supervoltage.

Another method of initiating and controlling integrated circuit testing includes providing a plurality of test modes, each test mode having a corresponding test mode address vector. At least one particular test mode of the plurality of test modes is initiated by executing a test enable cycle with a test mode address vector corresponding to the at least one particular test mode. The at least one particular test mode is latched. Supply voltage applied to the integrated circuit is detected and the latched at least one particular test mode is cleared as a function of the supply voltage.

An interface for initiating and controlling integrated circuit testing is also described. The interface includes a plurality of test mode address vectors, each test mode address vector corresponding to one of a plurality of test modes, and also includes a predetermined lockout address vector. The interface further includes an unlock enable input, a test enable input, and an address input. At least one particular test mode of the plurality of test modes is initiated when a first predetermined voltage is applied to the test enable input and a test mode address vector corresponding to the at least one particular test mode is applied to the address input. Further, the initiating of the at least one particular test mode is only enabled when the predetermined lockout address vector is applied to the address input and a second predetermined voltage is applied to the unlocked enable input. In a particular embodiment of this interface, the first predetermined voltage is the same level as the second predetermined voltage. In another embodiment of the interface, the first predetermined voltage is a supervoltage and the second predetermined voltage is a normal voltage.

An additional interface for initiating and controlling integrated circuit testing is also described. The interface includes a plurality of test mode address vectors, each corresponding to one of a plurality of test modes. The interface further includes a test enable input and an address enable input. At least one particular test mode of the plurality of test modes is initiated when a voltage is applied to the enable input and a test mode address vector corresponding to the at least one particular test mode is applied to the address input. A latch provides for latching the at least one particular test mode. The interface further includes a voltage threshold detector for detecting supply voltage provided to the interface and the integrated circuit and for generating a clear signal to clear all latch test modes when the detected supply voltage is below a predetermined threshold level. In another embodiment of this interface, the voltage threshold detector also generates the clear signal upon powerup.

In other embodiments of the methods of the invention, the integrated circuit is a DRAM. Likewise, in other embodiments of the apparatus of the invention, the integrated circuit is a DRAM.

DESCRIPTION OF THE PREFERRED EMBODIMENT

Figure 1:
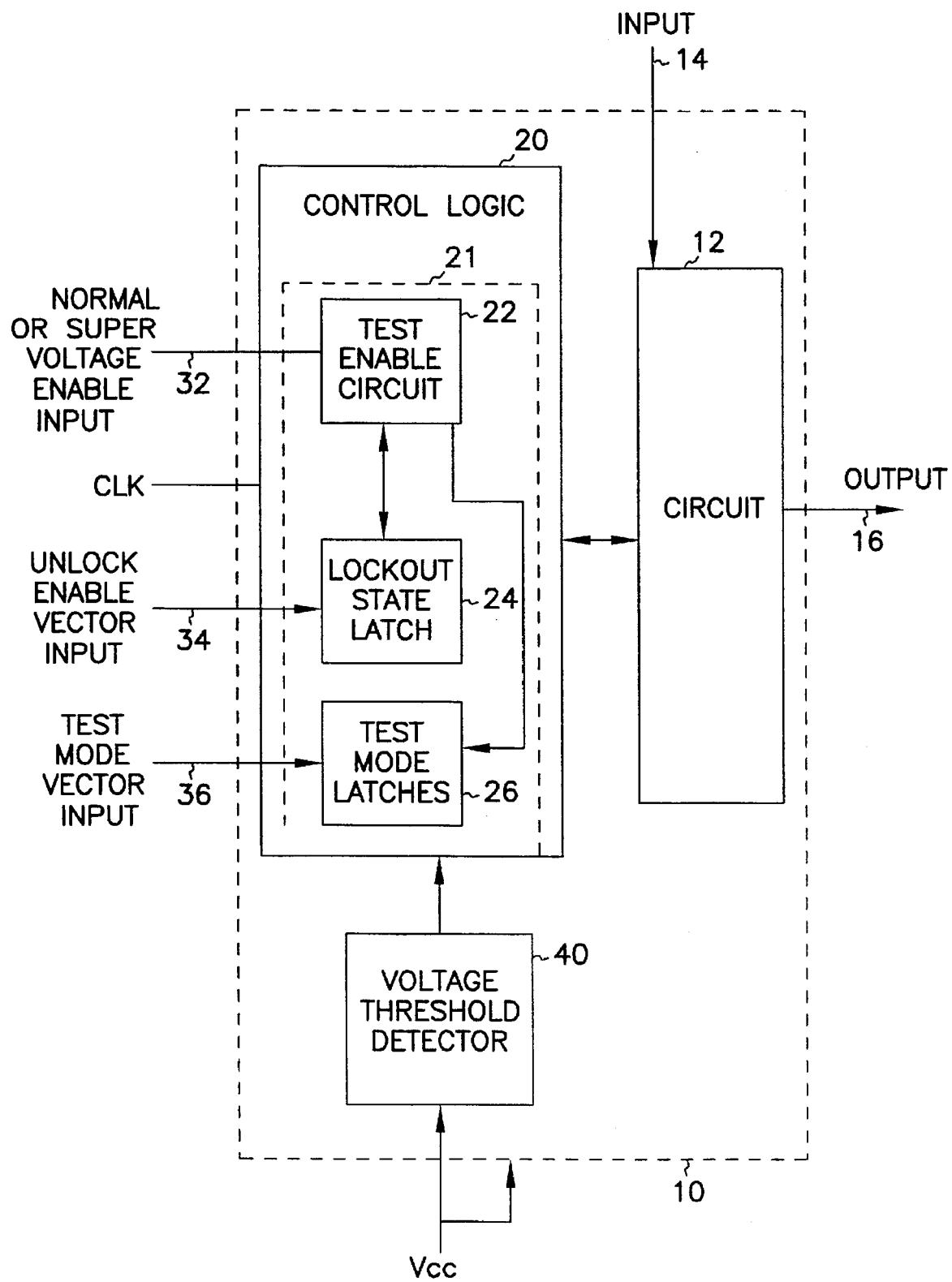
FIG. 1 is a diagram of an interface for initiating and controlling integrated circuit testing in accordance with the present invention.
Figure 3:
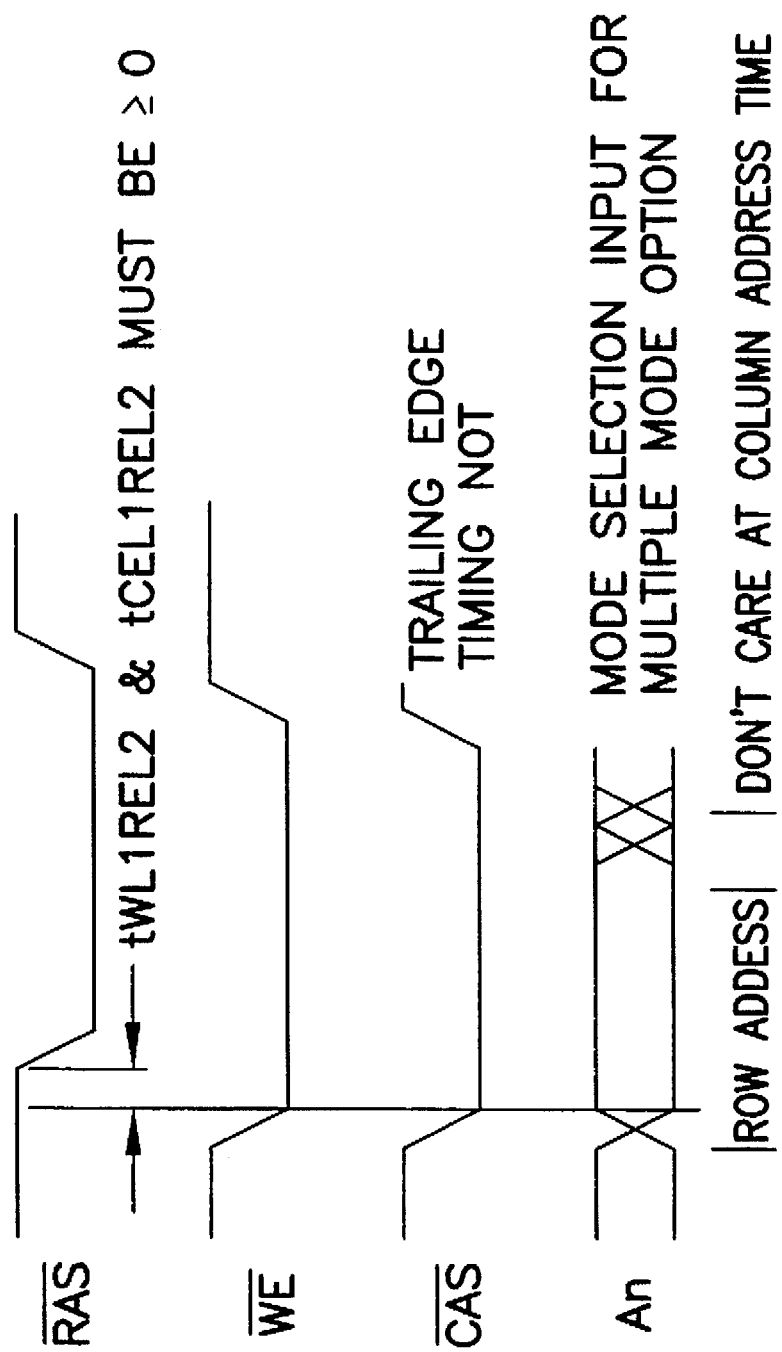
FIG. 3 is a timing diagram showing a WCBR clock sequence utilized in conjunction with DRAM testing in accordance with the present invention.
Figure 4:
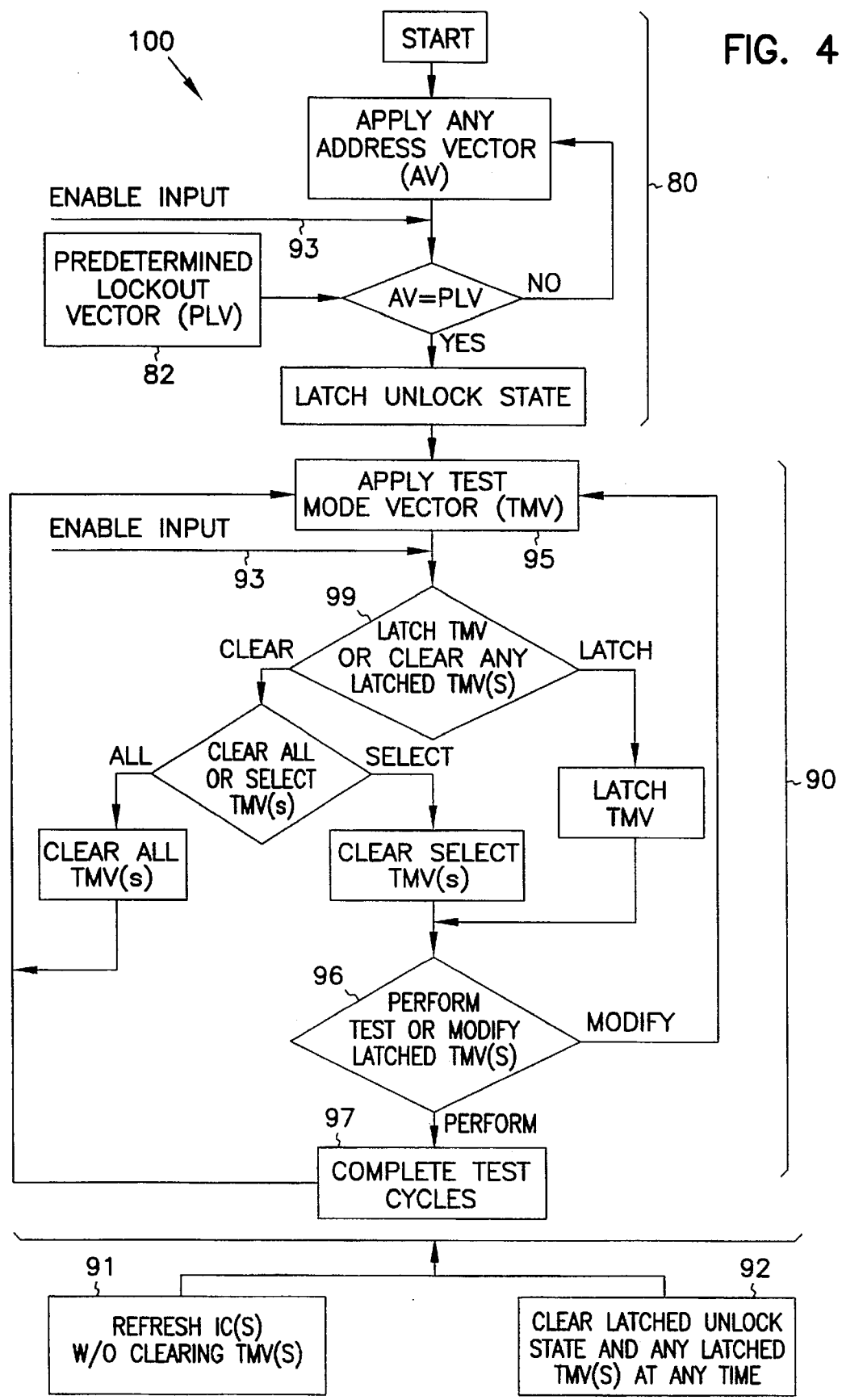
FIG. 4 is a diagram presenting the method for initiating and controlling integrated circuit testing in accordance with the present invention.

With reference to FIG. 1 and 4, a method and apparatus for initiating and controlling various test modes within an integrated circuit, such as a memory device, shall be generally described. Thereafter, the method and apparatus for initiating and controlling various test modes shall be particularly described with respect to dynamic random access memories (DRAMs) with reference to FIGS. 2–4.

Figure 2:
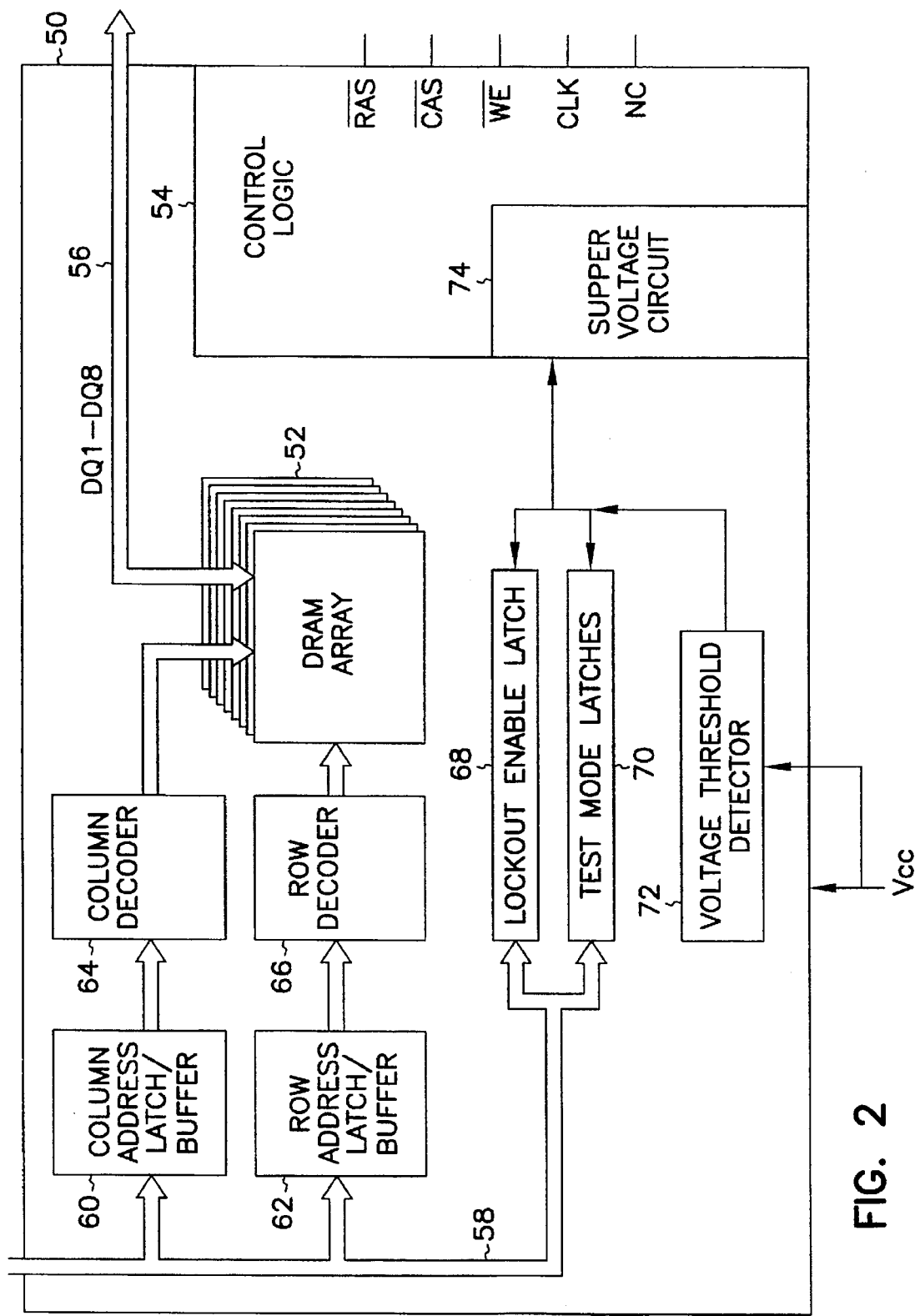
FIG. 2 is an interface for initiating and controlling DRAM testing in accordance with the present invention.

Generally, as shown in FIGS. 1 and 4, users are prevented from inadvertently entering test modes bemuse of safeguards associated with a two-step vectored methodology and the requirement for use of a supervoltage. The integrated circuit 10 includes circuit 12 to be tested and control logic 20 which may be for controlling the operation of the circuit 12 or just for testing circuit 12. Circuit 12 is in communication with control logic 20 and is a general block diagram of circuitry which may act upon an input 14 to produce an output 16, may input and store data, may read out data stored therein or may perform some other functional operation with respect to data. One skilled in the art will recognize that the type of functionality of circuit 12 may include memory circuitry, other logic circuitry, or any other functionality which requires test by the user to determine the integrity of or characterize the functionality of the integrated circuit 10. Control logic 20 includes an interface 21 for initiating and controlling various test modes for testing the integrated circuit 10. The interface 20 includes test enable circuit 22, lockout state latch 24, and test mode latches 26. Test enable circuit 22 receives supervoltage enable input 32 or, as will be described below, a normal enable input 32. Unlock enable vector input 34 is applied to lockout state latch 24 and test mode latches 26 receive test mode vector input 36. As shown in FIG. 2, the inputs 34 and 36 may be a single input.

Further, integrated circuit 10 includes a voltage threshold detector 40 for detecting supply voltage $V_{cc}$; the supply voltage $V_{cc}$ also being applied to the integrated circuit 10. One skilled in the art will recognize that integrated circuit 10 including circuit 12 may include a plurality of other inputs and outputs depending upon the type of functional circuit it represents. The present invention is not to be limited by specificity with regard to such inputs and outputs of the integrated circuit 10, but only as described in the accompanying claims.

The two-step vector technique for controlling and initiating test modes for integrated circuit 10 is shown in FIG. 4. The two steps include test enable step 80 and test mode initiation step 90. The test enable step 80 of the two-step vector technique 100 provides for enabling test mode vectors applied to test mode vector input 36 to be latched or cleared at test mode latches 26 in the test mode initiation step 90. Not until test enable circuit 22 is enabled will test mode vectors applied to input 36 be latched in test mode latches 26 or be used to clear test modes latched in such latches.

In the test enable step 80 of the two-step vector technique 100, an address vector or an unlock enable vector is applied to unlock enable input 34. Upon application of a normal voltage to enable input 32 such as shown by arrow 93 in FIG. 4 and during a particular cycle of control logic 20, the unlock enable vector applied to unlock enable vector input 34 is loaded and compared to a predetermined lockout vector 82 as shown in FIG. 4. If the address vector or unlock enable vector matches the predetermined lockout vector 82, then lockout enable latch 24 latches an unlocked state and enables test enable circuit 22 to proceed in initiating test modes. If, however, the address vector or unlock enable vector applied to unlocked enable vector input 34 does not match the predetermined lockout vector 82 during the application of a normal voltage on enable input 32 then initiation of test modes is inhibited. Further, other address vectors or unlocked enable vectors would then need to be applied to unlocked enable vector input 34 in order to further compare such address vectors with predetermined lockout vector 82 before initiation of test modes is possible.

After an unlocked state has been latched in lockout enable latch 24, then the test mode initiation step 90 of two-step vector technique 100 is performed. Test mode initiation step 90 of the two-step vector technique 100 allows test mode vectors applied to test mode vector input 36 to be entered and latched in test mode latches 26 during a particular cycle of control logic 20 and application of a normal voltage on normal or supervoltage enable input 32. However, as described above, test enable circuit 22 is unable to provide for latching of test mode vectors and test mode latches 26 until the unlock state is latched in lockout enable latch 24. Once a test mode vector is latched in test mode latch 26, the test mode is configured and is valid even if the normal voltage applied to test enable circuit 32 is removed after latching the test mode in test mode latches 26. This allows the normal or supervoltage enable input 32 to be a pin which is utilized in a normal functioning manner for integrated circuit 10 as opposed to a set-aside pin necessary only for test enable circuit 22. In other words, the normal or supervoltage enable input 32 is free for its normal operation once the test mode is latched.

As shown in the test initiation step 90 of FIG. 4, the test mode vector applied at block 95 will either be a new test mode to be latched, or a test mode vector indicating that previously latched test mode vectors be cleared or modified. When the test mode vector applied is a test mode vector which is to be latched into test mode latches 26, the test mode vector is latched and then as shown by decision block 96, the test mode is performed or a decision to modify the latched test mode is made. If the test mode latched is performed, it is performed in accordance with the test mode vector configuration corresponding to the latched test mode during subsequent operating cycles following the initiation cycle. The initiation cycle being the cycle latching the test mode. If the test mode is to be modified, the test mode vector configuration is modified by application of an additional test mode vector to test mode vector input 36. The additional test mode vector could be representative of either a vector which is to be latched in combination with previously latched test modes or a vector that clears select or all previously latched test modes.

If the additional test mode vector is representative of a vector which is to be latched in combination with previously latched test modes, then the vector is latched and the decision of block 96 is made once again. On the other hand, if the test mode vector indicates that a select number or all of previously latched test mode vectors be cleared, then such functionality is performed. If the test mode vector entered indicates that all the test modes are to be cleared, then all the test mode vectors latched in test mode latches 26 are cleared, and test mode vectors are then once again applied in subsequent cycles if desired. If, however, the test mode vector indicates that only a select number of the test mode vectors latched be cleared, then those select test mode vectors are cleared and the remaining test mode vectors define the configuration for test performance during subsequent operational cycles and the test mode configured is completed or a decision to modify the configuration is once again made at decision block 96.

Once the number of test cycles desired is completed per block 97, application of additional test modes can either clear or latch additional test configurations as indicated in the loop from complete test cycles back to applying additional test mode vectors in the test mode initiation step 90. Also, if after clearing select test mode vectors, it is desired to modify the test mode configuration, then additional test mode vectors are applied and entered upon application of the normal voltage to enable input 32 and during a particular cycle of control logic 20.

At any time during the first or second step of the two-step vector technique 100, it is possible to perform a particular cycle to clear the integrated circuit 10 without clearing the latched test mode vectors as shown by block 91. In addition, a particular cycle of control logic 20 can also clear the latched unlocked state and any latched test mode vectors in test mode latches 26 at any time during the two-step vector technique as shown in block 92 of FIG. 4.

In an alternate embodiment, a supervoltage is required to be applied to normal or supervoltage enable input 32 in order to latch the test mode vector applied to block 95. The use of the supervoltage as opposed to the normal voltage for initiating and latching the test modes in test mode initiation step 90 provides an additional safeguard for inadvertently entering a test mode. The use of the supervoltage to initiate the test modes will be further described below when describing the present invention in conjunction with DRAMs.

Generally, as shown in FIG. 1, the voltage threshold detector 40 is a CMOS voltage threshold detector like that described in U.S. Pat. No. 5,373,227, entitled "Control Circuit Responsive To Its Supply Voltage Level," currently assigned to the assignee hereof and incorporated entirely herein by reference thereto. The CMOS voltage detector circuit includes circuitry for monitoring the level of the power supply voltage $V_{cc}$ and generating control signals when the voltages cross critical thresholds. Such control signals will be utilized to clear all test mode latches when the supply voltage falls below a certain threshold voltage. In addition, the CMOS voltage threshold detector is used to clear all test mode latches 26 upon powerup, until the power supply voltage crosses a particular threshold. This ensures reliable operation of the test mode circuits and eliminates problems associated with powerup and unstable supply voltages; such problems including inadvertently latching test modes during a power supply surge. One skilled in the art will recognize that other voltage detector circuits may be utilized in the present invention, as long as the detector circuits perform similar function to the above described circuit.

The present invention shall now be particularly described with respect to DRAMs and with reference to FIGS. 2–4. Dynamic random access memory 50, as shown in FIG. 2, includes a DRAM array 52 which includes an array of dynamic memory cells. The DRAM array 52 is accessed by a microprocessor through data bus 56, a multiplexed address bus 58, row address strobe (RAS) and column address strobe (CAS), write enable input, clock input, no-connect pin, and by using other conventional control signals which are not shown but are known by one skilled in the art. A row address latch/buffer 62 and a row decoder 66 receive a row address from the multiplexed address bus 58, decode the row address received therefrom, and address or activate the corresponding row of DRAM array 52. A column address latch/buffer 60 and a column decoder 64 receive a column address signal from address bus 58, decode a column address therefrom, and address or activate the corresponding column of DRAM array 52. Under control of control logic 54, and inputs thereto, operational functions such as read and write functions are performed with respect to the DRAM array. FIG. 2 is a very general drawing of a DRAM and should not be taken as being limiting to the types of DRAMs with which the present invention functions. Many types of memory devices and different types of DRAMs, including multiport DRAMs and video random access memories (VRAMs), will benefit from the present invention. The present invention is more concerned with the testing of such memory devices as opposed to the functional operations of the devices.

Jedec Standard No. 21-C, herein incorporated in its entirety by reference thereto, as described in the Background of the Invention section, describes a logic interface to initiate and control various test modes for DRAMs by performing a WCBR cycle with a row address, which defines the test mode to be implemented. For example, a basic test mode which must be implemented if the memory device is to meet the Jedec standard, is described therein.

The present invention provides for the initiation and control of various other test modes for testing DRAM 50 with safeguards above any described in the Jedec standard. Control logic 54, including supervoltage circuit 74, along with lockout enable latch 68 and test mode latches 70 allow for protection against inadvertently entering various test modes with a two-step vector technique 100 as shown in FIG. 4. Further, voltage detector 72 of DRAM 50 is used to clear all test mode latches upon powerup and whenever the supply voltage $V_{cc}$ falls below a certain threshold level. This assures that the test mode latches do not inadvertently latch during powerup or during power supply hiccups or surges.

Some of the various test modes which can be configured by entry of corresponding test mode vectors include, for example, a test mode which copies the previous page of data into a new row and keeps copying such data into subsequent rows. Such test mode would have its own test mode address vector to configure the DRAM 50 for such test. Additional test modes may be combined with this test mode and a combined test mode configuration would result from the combined test mode address vectors. However, some test mode combinations are not compatible with one another. For example, an all rows high test and a row copy test mode could not be utilized together. The variety of test modes designating various configurations is virtually limitless, and the present invention is not limited to any particular test mode. The present invention, rather than being concerned with the test mode configurations, is concerned with a reliable method for initiating and controlling the various test modes for DRAM 50.

The two-step vector technique 100 as shown in FIG. 4, includes test enable step 80 and test mode initiation step 90 to provide this reliable method. The test enable step 80 controls whether the test mode initiation step may proceed or may not proceed. The test enable step 80 of the two-step vector technique 100, entails executing a WCBR cycle with a normal voltage being applied to an enable input 93, such as no connect pin of control logic 54, and an address vector being applied on address bus 58. A timing diagram for the WCBR cycle is shown in FIG. 3 and is commonly known to one skilled in the art as are many other cycled functions of a DRAM. If the address vector applied during such WCBR cycle is not a match with a predetermined lockout vector 82 then supervoltage circuits 74 are not enabled and test mode initiation step 90 of the two-step vector process 100 is inhibited. Other address vectors are then applied until a match is found. If control logic 54 indicates a match between the address vector applied via address bus 58 and the predetermined lockout vector 82, then lockout enable latch 68 latches to an unlocked state which enables supervoltage circuit 74. When supervoltage circuit 74 is enabled, then, and only then, can test mode initiation step 90 be performed.

After the supervoltage circuit 74 has been enabled, a supervoltage WCBR cycle is executed with a supervoltage applied to enable input 93, such as the no connect pin, and a test mode vector applied to address bus 58 as shown in block 95. The test mode vector is either latched or the test mode vector specifies that previously latched test mode vectors are to be cleared as shown by decision block 99. If the test mode vector is such that a particular test mode is to be configured, then the test mode is latched in test mode latches 70. In other words, when a test mode vector for configuring a particular test mode is applied to DRAM 50 by address bus 58, and a supervoltage is applied to a supervoltage pin while performing a WCBR cycle, the test mode address vector is utilized to configure the test mode and the test mode is latched.

The supervoltage pin may be the no-connect pin, or may be an address or other control pin such as an output enable pin. The supervoltage pin can be an address or control pin because the test mode entered is latched and the supervoltage need not be maintained to keep the test mode valid.

As shown by decision block 96, after the test mode is latched and the test mode configured, the test mode is either performed during operational cycles after the initiation cycle in which the test mode is initiated as described above or the test mode is modified by latching other test mode vectors applied during additional supervoltage WCBR cycles. If the test mode configuration is to be modified, an additional test mode vector is applied at block 95 and entered during execution of a supervoltage WCBR cycle with a supervoltage applied to the test enable input 93. The additional test mode vector may be a test mode that can be combined with or modify the current test mode configured or it may be a test mode vector indicating that all or select test mode vectors already latched should be cleared. This is shown in decision block 99. If the additional test mode vector indicates that latched test mode vectors are to be cleared, then either all or select test mode vectors are cleared as specified thereby. If all the test mode vectors are to be cleared, then they are cleared and additional test mode vectors must be applied during supervoltage WCBR cycles to further define test mode configurations. If only a select number of test mode vectors are to be cleared, then such select test mode vectors are cleared and a test mode configuration results from the remainder of the test mode vectors latched. This test mode is then either performed or modified as per decision block 96.

At any time during the process, a row address strobe (RAS) only refresh cycle will terminate all test modes and clear any and all test mode latches 70, including the lockout enable latch 68. This is shown as block 92 in FIG. 4. In addition, a column address strobe before row address strobe (CBR) refresh cycle will refresh the DRAM 50 while in the test mode latched at that particular time, but will not clear any of the latched test mode vectors from latches 70 or the lockout latch 68. The type of cycle utilized to perform such clearing functions and refresh functions, may vary. For example, the RAS refresh only cycle may be utilized to refresh the DRAM 50 without clearing any test mode vectors and the CBR refresh may be utilized to clear the latched unlocked state and any latched test mode vectors at any time.

In an alternate embodiment, the use of supervoltages to enter test mode vectors need not be utilized, but rather a normal voltage can be utilized to perform the same function. As such, test modes would be initiated, not by application of a supervoltage WCBR cycle, but rather a normal voltage WCBR cycle. However, the additional safeguard of using the supervoltage would be lost.

The CMOS voltage threshold detector circuit 72, which is a threshold detector circuit like that described in U.S. Pat. No. 5,373,227, which is hereby incorporated in its entirety by reference thereto, is used to clear all test mode latches on powerup whenever the supply voltage falls below a certain threshold voltage. The threshold detector receives supply voltage $V_{cc}$ and compares such voltage to predetermined threshold levels. When such levels are crossed, a signal is applied to the lockout enable latch 68 and test mode latches 70 to clear the latches. Upon powerup, test mode latches are cleared until a threshold voltage level is crossed. This ensures reliable operation of the test mode circuits and eliminates problems associated with the powerup and unstable supply voltage. As described above, other voltage threshold detectors which perform similar functions may be utilized.

One skilled in the art will readily recognize that each of the concepts described above can be utilized in combination or separately to provide for more reliable initiation and control of test modes. For example, the two-step vector technique may be utilized with a supervoltage for test mode initiation with a normal voltage being utilized for supervoltage test mode enable or the unlocking step 80 of the two step vector process 100. Further, the voltage threshold detector may be utilized in conjunction with the two-step vector process or in conjunction with only the test initiation process 90 without the unlock procedure 80 of the two step vector process. These are only illustrations of the combinations of these techniques, and the present invention is not limited thereby but is rather defined by the scope of the accompanying claims.

It is to be understood, however, that even though numerous characteristics of the present invention have been set forth in the foregoing description, together with details of the structure and function of the invention, the disclosure is illustrative and changes in matters of order, shape, size, and arrangement of the parts, and various properties of the operation may be made within the principles of the invention and to the full extent indicated by the broad general meaning of the terms in which the appended claims are expressed.

What is claimed is:

1. A method for initiating and controlling integrated circuit testing the method comprising the steps of:
   providing a plurality of test modes, each test mode having a corresponding test mode address vector;
   enabling a test enable cycle by executing an unlock enable cycle with a predetermined lockout address vector; and
   initiating at least one particular test mode of the plurality of test modes by executing the test enable cycle with a test mode address vector corresponding to the at least one particular test mode.

2. The method of claim 1, further comprising the step of latching the at least one particular test mode of the plurality of test modes.

3. The method of claim 2, further comprising the step of initiating one or more additional test modes of the plurality of test modes by executing additional test enable cycles with one or more additional test mode address vectors corresponding to the one or more additional test modes.

4. The method of claim 2, further comprising the steps of:
   detecting supply voltage applied to the integrated circuit; and
   clearing the latched at least one particular test mode as a function of the detected supply voltage.

5. The method according to claim 3, wherein the step of enabling the test enable cycle by executing the unlock enable cycle with the predetermined lockout address vector results in a latched test enable state, the method further includes the step of clearing the latched test enable state along with any latched test modes.

6. The method according to claim 3, further comprising the step of refreshing the integrated circuit while maintaining any latched test modes.

7. The method according to claim 3, further comprising the step of selectively clearing one or more of any latched test modes.

8. The method according to claim 1, wherein the test enable cycle includes a supervoltage test enable cycle executable with a supervoltage.

9. The method of claim 8, further comprising the step of latching the at least one particular test mode of the plurality of test modes.

10. The method of claim 8, further comprising the step of initiating one or more additional test modes of the plurality of test modes by executing additional supervoltage test enable cycles with one or more additional test mode address vectors corresponding to the one or more additional test modes.

11. The method of claim 8, further comprising the steps of:
   detecting supply voltage applied to the integrated circuit; and
   clearing the latched at least one particular test mode as a function of the detected supply voltage.

12. The method according to claim 10, wherein the step of enabling the supervoltage test enable cycle by executing the unlock enable cycle with the predetermined lockout address vector results in a latched test enable state, the method further includes the step of clearing the latched test enable state along with any latched test modes.

13. The method according to claim 10, further comprising the step of refreshing the integrated circuit while maintaining any latched test modes.

14. The method according to claim 10, further comprising the step of selectively clearing one or more of any latched test modes.

15. The method according to claim 1, wherein the integrated circuit is a dynamic random access memory (DRAM) and further wherein the initiating step includes initiating at least one particular test mode of the plurality of test modes by executing a supervoltage write enable column address strobe before row address strobe (WCBR) cycle with the test mode address vector corresponding to the at least one particular test mode and the enabling step includes enabling the supervoltage WCBR cycle by executing an unlock WCBR cycle with the predetermined lockout address vector.

16. The method of claim 15, further comprising the step of latching the at least one particular test mode of the plurality of test modes such that the supervoltage need no longer be maintained.

17. The method of claim 16, further comprising the step of initiating one or more additional test modes of the plurality of test modes by executing additional supervoltage WCBR cycles with one or more additional test mode address vectors corresponding to the one or more additional test modes and latching the one or more additional test modes.

18. The method according to claim 16, further comprising the steps of:
   detecting supply voltage applied to the DRAM; and
   clearing the latched at least one particular test mode when the detected supply voltage falls below a predetermined threshold voltage level.

19. The method according to claim 16, wherein the step of enabling the supervoltage WCBR cycle by executing the unlock WCBR cycle with the predetermined lockout address vector results in a latched supervoltage test enable state, the method further includes the step of clearing the latched supervoltage test enable state along with any latched test modes by executing one of a row address strobe (RAS) only refresh and a column address strobe before row address strobe (CBR) refresh.

20. The method according to claim 19, further including the step of refreshing the DRAM while maintaining the latched at least one particular test mode by executing the other of a RAS only refresh and a CBR refresh.

21. The method according to claim 16, further comprising the step of selectively clearing one or more of any latched test modes by executing a WCBR cycle with a predetermined clear test vector.

22. A method for initiating and controlling integrated circuit testing, the method comprising the steps of:
   providing a plurality of test modes, each test mode having a corresponding test mode address vector;
   initiating at least one particular test mode of the plurality of test modes by executing a test enable cycle with a test mode address vector corresponding to the at least one particular test mode;
   latching the at least one particular test mode of the plurality of test modes;
   detecting supply voltage applied to the integrated circuit; and
   clearing the latched at least one particular test mode as a function of the detected supply voltage.

23. An interface for initiating and controlling integrated circuit testing, comprising:

a plurality of test mode address vectors, each test mode address vector corresponding to one of a plurality of test modes;

a predetermined lockout address vector;

an unlock enable input;

a test enable input;

an address input;

means for initiating at least one particular test mode of the plurality of test modes when a first predetermined voltage is applied to the test enable input and a test mode address vector corresponding to the at least one particular test mode is applied to the address input; and unlock enable means for enabling the initiation means when the predetermined lockout address vector is applied to the address input and a second predetermined voltage is applied to the unlock enable input.

24. The interface according to claim 23, wherein the first predetermined voltage is the same level as the second predetermined voltage.

25. The interface according to claim 23, wherein the fast predetermined voltage is a supervoltage and the second predetermined voltage is a normal voltage.

26. The interface according to claim 25, wherein the initiation means includes means for latching the at least one particular test mode of the plurality of test modes.

27. The interface according to claim 26, further including a voltage threshold detector for detecting supply voltage provided to the interface and integrated circuit and for generating a clear signal to clear all latched test modes upon power-up and when the detected supply voltage is below a predetermined threshold level.

28. The interface according to claim 25, wherein the integrated circuit is a dynamic random access memory (DRAM) and further wherein the initiating means includes means for initiating at least one particular test mode of the plurality of test modes when a supervoltage WCBR cycle is executed via the test enable input with the test mode address vector corresponding to the at least one particular test mode being applied to the address input and wherein the unlock enable means includes means for enabling the supervoltage WCBR cycle by executing a WCBR cycle via the unlock enable input with a predetermined lockout address vector being applied to the address input.

29. An interface for initiating and controlling integrated circuit testing, comprising:

a plurality of test mode address vectors, each corresponding to one of a plurality of test modes;

a test enable input;

an address input;

means for initiating at least one particular test mode of the plurality of test modes when a voltage is applied to the enable input and a test mode address vector corresponding to the at least one particular test mode is applied to the address input, the initiation means including means for latching the at least one particular test mode of the plurality of test modes; and a voltage threshold detector for detecting supply voltage provided to the interface and integrated circuit and for generating a clear signal to clear all latched test modes when the detected supply voltage is below a predetermined threshold level.

30. The interface according to claim 29, wherein the voltage threshold detector also generates the clear signal upon power-up.

* * * * *

UNITED STATES PATENT AND TRADEMARK OFFICE
CERTIFICATE OF CORRECTION

PATENT NO. : 5,651,011

DATED : July 22, 1997

INVENTOR(S) : Keeth

It is certified that error appears in the above-identified patent and that said Letters Patent is hereby corrected as shown below:

In column 11, line 23, please delete "fast" and insert --first-- therefor.

In column 9, line 12, please add after testing --,-- therefor.

Signed and Sealed this

Second Day of December,1997

Attest:

BRUCE LEHMAN

Attesting Officer

Commissioner of Patents and Trademarks